(12) United States Patent
Correale, Jr. et al.

(10) Patent No.: US 6,570,401 B2
(45) Date of Patent: May 27, 2003

(54) DUAL RAIL POWER SUPPLY SEQUENCE TOLERANT OFF-CHIP DRIVER

(75) Inventors: Anthony Correale, Jr., Raleigh, NC (US); Terry Cain Coughlin, Jr., Endicott, NY (US); Douglas Willard Stout, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 09/758,054

(22) Filed: Jan. 10, 2001

(65) Prior Publication Data

US 2002/0089350 A1 Jul. 11, 2002

(51) Int. Cl.[7] ................... H03K 19/007; H03K 19/0948
(52) U.S. Cl. ................ 326/14; 326/58; 326/81; 361/92
(58) Field of Search .................. 326/57, 58, 83, 326/80, 81, 14; 361/21, 92

(56) References Cited

U.S. PATENT DOCUMENTS

| | | |
|---|---|---|
| 5,136,191 A | 8/1992 | Nunogami |
| 5,378,943 A | 1/1995 | Dennard |
| 5,408,147 A | 4/1995 | Yarbrough et al. |
| 5,512,844 A | 4/1996 | Nakakura et al. |
| 5,513,140 A | 4/1996 | Merritt |
| 5,631,579 A | 5/1997 | Miki et al. |
| 5,834,948 A | 11/1998 | Yoshizaki et al. |
| 5,896,045 A | 4/1999 | Siegel et al. |
| 5,917,339 A | 6/1999 | Kim |
| 5,933,025 A | 8/1999 | Nance et al. |
| 5,995,010 A * | 11/1999 | Blake et al. ............... 340/653 |
| 6,040,708 A * | 3/2000 | Blake et al. ............... 326/33 |
| 6,107,830 A * | 8/2000 | Okumura ................... 326/58 |
| 6,292,025 B1 * | 9/2001 | Okumura ................... 326/58 |

* cited by examiner

Primary Examiner—Daniel Chang
(74) Attorney, Agent, or Firm—Schmeiser, Olsen & Watts, LLP; Scott W. Reid

(57) ABSTRACT

The protection circuit of the present invention addresses the problem of indeterminate logic levels caused by loss of one of the power supplies in a two-power-supply CMOS integrated circuit. The circuit of the present invention replaces the typical scheme of power supply sequencing to fix the problem. The circuit disclosed herein detects the state of the core voltage and disables the output drivers when the core voltage is detected as being off. The disabled drivers are put into a high impedance state, thereby eliminating the potential for damage and eliminating the need for power supply sequencing. The invention also protects against the sudden loss of the integrated circuit core voltage, VDD, power supply during normal operation.

18 Claims, 2 Drawing Sheets

DUAL RAIL POWER SUPPLY SEQUENCE TOLERANT OFF-CHIP DRIVER

BACKGROUND OF THE INVENTION

1. Technical Field

The present invention relates generally to the field of integrated circuits. In particular, this invention relates to power supplies for integrated circuits and to an improved and simplified method for providing a stable source of power for a complementary metal oxide semiconductor (CMOS) integrated circuit utilizing a split-rail or dual power supply.

2. Related Art

The field of integrated circuitry is a rapidly developing field of technology. Integrated circuits are continually being made smaller with the attendant requirements of increasing both device speed and circuit density. The miniaturized devices built within and upon a semiconductor substrate are spaced very closely together and the integrated circuit density, that is, the number of integrated circuits per unit of surface area, continues to increase significantly. The highest integrated circuit density is achieved using Field Effect Transistors (FETs). A FET is a device having a source, gate, and drain arranged such that when a high logic signal voltage is applied to the gate, current may pass from the source to the drain. Similarly, a FET does not allow current to pass between the source and the drain when a low logic signal is applied to the gate.

As the integrated circuit density increases, the amount of power dissipated by the integrated circuits on the substrate increases proportionally. The amount of power dissipation is a concern because complicated heat sinks and circuit packaging may be required to prevent the chip temperature from rising above its rated operational temperature limit. Further, many devices containing integrated circuits typically operate on stored power. One example is a portable computer operating on battery power. As power dissipation increases, battery life decreases, and the shorter the operational life of the electronic device. Therefore, reducing the power consumption for a given integrated circuit density is important to the design of integrated circuits.

One way to decrease this power consumption is to reduce the voltage at which the circuits operate. However, decreasing the operational voltage level creates a compatibility problem because some integrated circuits are designed to operate at predetermined, specific voltage levels. For example, some circuits may interface with low voltage circuits, and these same circuits may need to operate at higher voltage levels to operate electro-mechanical devices. Also, there are many existing integrated circuits that cannot have their operating voltage altered, and yet, new, lower voltage circuits must interact with them. Therefore, in order to lower the voltage of integrated circuits so that they dissipate less power, and still permit their interaction with different or existing hardware, some form of interface circuitry is required.

The related art has provided a variety of interface circuits for translating lower voltage levels into higher voltage logic levels and vice versa. This is primarily due to the fact that logic voltage levels implemented in integrated circuits have been steadily decreasing as technologies evolve.

In general, complementary metal oxide semiconductor (CMOS) integrated circuits require more than one power supply per chip. Such designs are known in the art as "split rail designs." For instance, a split rail design is utilized when the internal or core chip voltage, VDD, operates at a different voltage level than the input/output (I/O) interface voltage, or the output driver voltage, OVDD. The integrated circuit core voltage, VDD, is limited by the integrated circuit technology or power dissipation requirements of the chip, as well as the driver output voltage, OVDD.

Split rail designs create many challenges that must be addressed by both integrated circuit designers and system designers. For a typical split rail integrated circuit to operate properly, both of the power supplies must be in their powered-up state. Numerous problems can occur when one supply is "off" while the other is "on." Problems can also occur when the sequence in which the two supplies are powered up or powered down becomes critical.

One example of such a problem occurs when the integrated circuit core voltage, VDD, is in an off state and the output drivers are powered up via the output driver voltage, OVDD. In this situation, the output drivers will have lost all the control signals from the integrated circuit core which are derived from the integrated circuit core voltage, VDD. With no control signals to the drivers, the drivers' output stages may try to pull the output pad both up and down at the same time. This scenario is characterized by a high crossover current effect from the output driver voltage, OVDD, to ground, which can be multiplied by hundreds of drivers throughout the chip thereby causing permanent equipment damage.

This problem has been solved in the related art by requiring power supply sequence rules that dictate that the internal chip voltage VDD must power up before the driver voltage OVDD. This ensures that there are valid logic levels at the "DATA" and "ENABLE" inputs of the driver before the driver is powered up. A power-down sequence is also required such that the OVDD is powered down before VDD for the same reasons described in the power-up sequence.

There is also the case wherein there is a sudden loss of VDD after both supplies are up and running. This can be due to the VDD supply failing and causing the high current condition in the output drivers. For this final case, there must be some intelligence in the system that forces OVDD off if there is a sudden and permanent loss of VDD.

This level of sophistication is not always available in power supplies used to power integrated circuits. The solution this invention provides places no restrictions on power supply sequence or the sudden loss or failure of a power supply. This small amount of circuitry added to the driver design is noninvasive, and therefore will not affect driver performance.

SUMMARY OF THE INVENTION

The present invention solves these problems in the related art by breaking the series path through the driver's output stage when the core voltage is detected to be "off." The conduction path between OVDD and GND is broken, thereby eliminating the potential for damage and eliminating the need for power supply sequencing requirements. The invention also protects against the sudden loss of the VDD power supply during otherwise normal operation.

The present invention provides a semiconductor chip, comprising: a first plurality of circuits connected to a first voltage contact having a first voltage potential, and to a ground contact; a second plurality of circuits connected to a second voltage contact having a second voltage potential, and to said ground contact; a detection circuit connected to said first voltage contact, said second voltage contact, and said ground contact, and having an output node; said detection circuit adapted to operate by detecting the loss of voltage potential at said first voltage contact; said detection circuit adapted to pull said output node to said second voltage potential when said first voltage potential and said second voltage potential are both present; and said detection circuit adapted to pull said output node to ground potential when said first voltage potential is not present.

Another aspect of the invention is to provide a semiconductor interface circuit for translating lower voltage logic levels into higher voltage logic levels, comprising: a first voltage contact; a second voltage contact; a ground contact; a sensing circuit which monitors the voltage levels at the first and second voltage contacts; and a detection circuit having an output node, and adapted to force said output node to ground potential, only when a second voltage source is connected to said second voltage contact and no voltage source is connected to said first voltage contact; and wherein the semiconductor interface circuit is adapted to enter a high impedance state when said output node is pulled to said ground potential at the ground contact.

The present invention also presents a method of protecting circuitry in a semiconductor chip, comprising: providing a first plurality of circuits connected to a first voltage contact and a ground potential contact; providing a second plurality of circuits connected to a second voltage contact and said ground potential contact; providing a detection circuit connected to said first voltage contact and said second voltage contact, and having an output node, said detection circuit operating by forcing said output node to said ground potential contact only when a second voltage source is connected to said second voltage contact and no voltage source is detected at said first voltage contact; and connecting at least one of said second plurality of circuits to said output node of said detection circuit.

The present invention further provides a two-supply input/output protection circuit comprising: a driver input stage having a data input and an enable input; a detection stage having a pre-drive stage comprising a NAND gate and a NOR gate, said detection stage operationally connected to an output of said input stage; an output stage operationally connected to an output of the pre-drive stage; and a loss detection stage having an inverter stage and a voltage bias stage, said inverter stage operationally connected to said driver input stage, and said voltage bias stage operationally connected to said output stage.

The present invention additionally provides a two-supply input/output protection circuit comprising: a driver input stage having a data input and an enable input; a detection stage having a pre-drive stage comprising a NAND gate and a NOR gate, said detection stage operationally connected to an output of said input stage; an output stage operationally connected to an output of the pre-drive stage; a loss detection stage having an inverter stage and a voltage bias stage, said inverter stage operationally connected to said driver input stage, and said voltage bias stage operationally connected to said output stage; and an inverting levels translation circuit for detecting the loss of a first voltage potential.

The foregoing and other features of the invention will be apparent in the following and more particular description of the embodiments of the invention as illustrated in the accompanying drawings.

BRIEF DESCRIPTION OF THE DRAWINGS

Several embodiments of this invention will be described in detail, with reference to the following figures, wherein like designations denote like elements, and wherein.

DETAILED DESCRIPTION OF THE INVENTION

Figure 1:
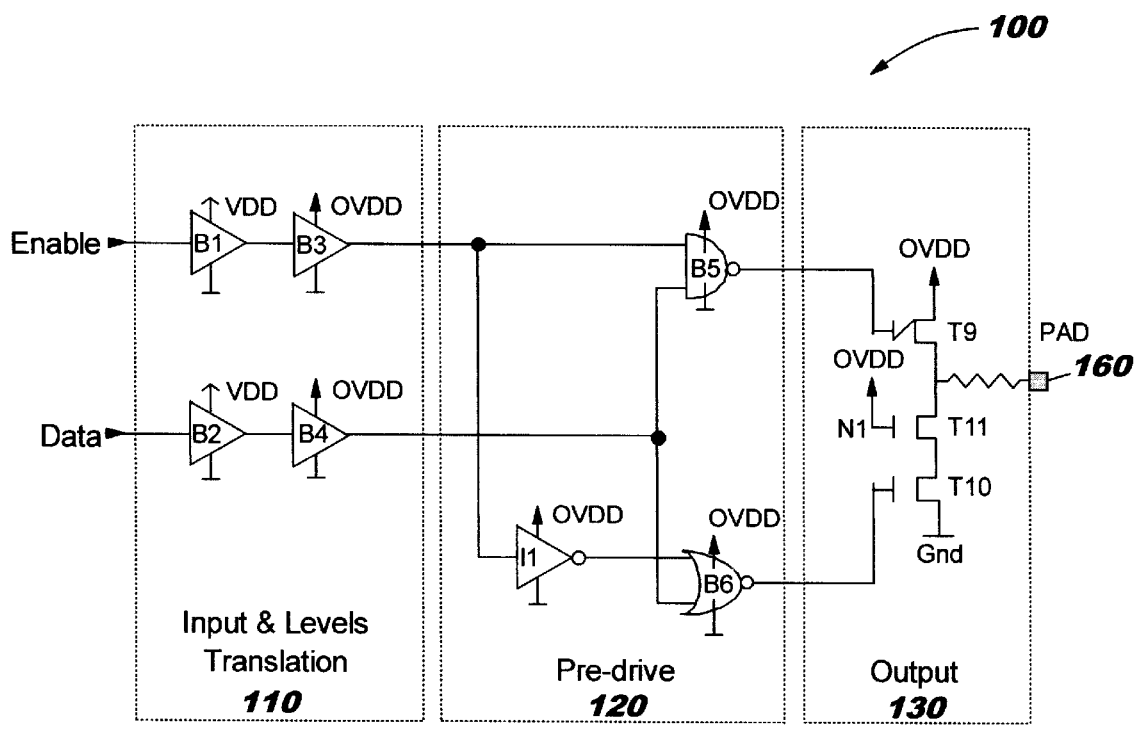
FIG. 1 depicts a schematic diagram of a typical two power supply output driver circuit of the related art.

Referring to the drawings, FIG. 1 illustrates an example of the related art problem discussed supra. The off-chip driver circuit 100 shown in FIG. 1 illustrates a typical two-power-supply output driver circuit. The off-chip driver circuit 100 includes an input and levels translation stage 110, a pre-drive stage 120, and an output stage 130. In this example, the integrated circuit's internal core voltage, VDD, is nominally about 2.5 volts, while the output driver voltage, OVDD, is nominally about 3.3 volts. A first input, labeled "DATA", is the off-chip driver input and a second input, labeled "ENABLE", is used to switch the output stage 130 into a high impedance state.

During normal operation, 2.5 volt logic data from the integrated circuit core is present at the DATA and ENABLE inputs to the input and levels translation stage 110 of the off-chip driver circuit 100. Buffer circuits B1 and B2 pass the data to buffer circuits B3 and B4, respectively, which convert, or level shift, the nominal 2.5 volt logic to nominal 3.3 volt logic. From this point, the remaining circuitry is a typical 3.3 volt driver consisting of the pre-drive stage 120 and the output stage 130. The pre-drive stage 120 is a NAND/NOR pre-drive circuit used to control the rate of change of the driver circuit 100 output current (di/dt), and also to fundamentally perform the required Boolean function of NANDing/NORing the DATA and ENABLE inputs.

During operation, when the 3.3 volt supply, OVDD, powers up before the 2.5 volt supply, VDD, or when there is a sudden loss of the 2.5 volt supply, VDD, during otherwise normal operation, the logic levels at the DATA and ENABLE inputs to the driver circuit 100 become indeterminate. Because the off-chip driver circuit 100 output devices, transistors T9, T10 and T11, are powered by the 3.3 volt supply, the off-chip driver circuit 100 is capable of supplying current from 3.3 volts to ground through transistors T9, T10, and T11.

One method of preventing this situation from occurring is to detect the loss of the 2.5 volt supply, and force a logic zero at node N1 (i.e., the gate of transistor T11). Typically, the gate of transistor T11 is connected directly to the OVDD supply. This series output device, transistor T11, whose gate is hard-wired to the output power supply, OVDD, reduces the drain-to-source and drain-to-gate potentials when a high(er) output voltage is applied in a tri-state condition. This is done for reasons of enhanced overall device reliability and life span.

The idea behind the present invention is to convert the hard-wired connection of the gate of transistor T11 (i.e., node N1), and actively bias it by a detection circuit which will force OVDD volts when the VDD supply is active, and force GND potential when the loss of VDD is detected. This will ensure that the device stack of the output stage 130 no longer has a connection to ground when VDD is not present. The power up/down duration is insignificant relative to the operating lifetime of the driver, and hence, will not significantly degrade reliability. This scheme can be used in lieu of the tri-stating means disclosed in U.S. patent application Ser. No. 09/541,196 entitled "Two-supply Protection Circuit"

which is incorporated herein by reference. The use of either of these approaches will disable the off-chip driver from sinking unwanted current during a power supply on or off sequence, or when the VDD supply is lost while OVDD is present. However, the present invention's scheme doesn't inhibit any current from OVDD to PAD as the tri-stating disclosure.

There are multiple methods to effect the goal of blocking the short circuit current when VDD is inactive and OVDD is active. One such known method is to connect node N1 (FIG. 1) of the off-chip driver to VDD. Then, when VDD is active, NFET device T11 will be turned on and the path to ground is enabled. When VDD is inactive, off-chip driver NFET device T11 is turned off and the path to ground is disabled.

While this simple approach of the related art will solve the conductance problem, it introduces three others. First, the conductance of the transistor T11 is greatly reduced due to the reduced overdrive supplied by gate potential VDD. To compensate for this, the size of transistor T11 must be greatly increased at the sacrifice of area and output capacitance. Second, and more importantly, the use of VDD in the off-chip driver NFET stack (T9, T10, T11) means that any designer who wants to reduce the core VDD for power-consumption reasons impacts the output characteristics of the off-chip driver. This can cause problems in applications in which VDD is taken to relatively low levels (inevitably below those anticipated) and/or in which tracking between VDD and OVDD is not managed well. Third is the issue of reliability. The use of VDD as a transistor gate bias will increase the transistor's drain-to-gate bias during both normal operation and tri-state modes. This will seriously degrade the reliability of the device. Hence, for these reasons another means must be employed.

Figure 2:
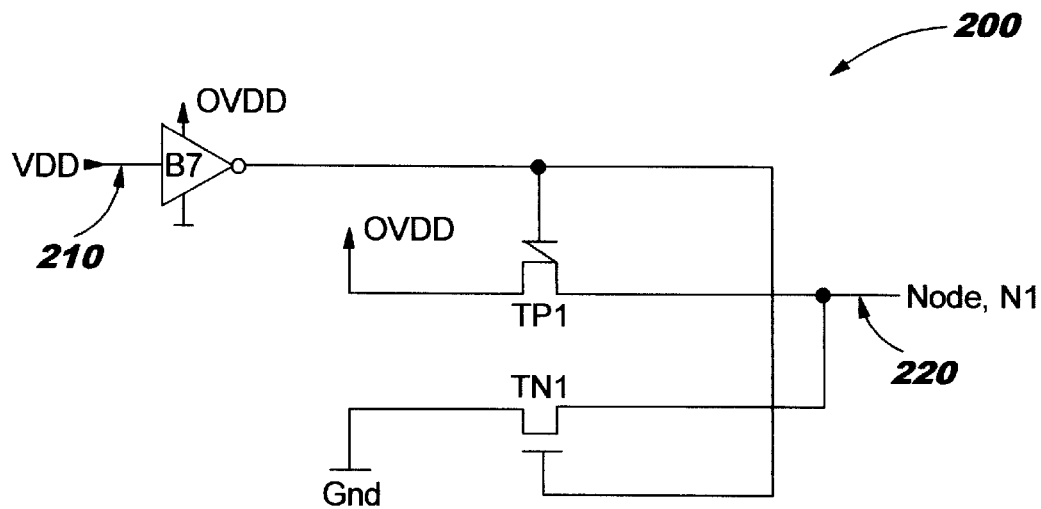
FIG. 2 depicts a schematic diagram of a circuit of the present invention that detects the loss of the VDD supply and forces the node N1 (i.e., the gate of NFET T11) to a logic zero or ground potential.

According to the present invention, a novel method of detecting the loss of the 2.5 volt supply and forcing the node N1 (i.e., the gate of NFET device T11) to a logic zero or ground is presented in FIG. 2. The circuit 200 of FIG. 2 will be inserted into the off-chip driver circuit 100 of FIG. 1, and connected to node N1, in place of the existing OVDD connection to node N1, shown in FIG. 1 in the output stage 130.

In FIG. 2, levels translating circuit B7 employs an inverting configuration. The levels translating circuit B7 may include the inverting levels translation circuit 300 of FIG. 3 (discussed infra), or levels translating circuit B7 may include any other suitable levels translating circuit.

The input 210 of B7 is connected to the internal core voltage supply, VDD. The output 220 of B7 will achieve GND potential when VDD is present, and will achieve OVDD potential when VDD is not present (see FIG. 2). Transistors TN1 and TP1 are configured as a selector circuit. Transistor TN1 is an NFET device with its drain connected to GND, source connected to output node N1, and gate connected to the output of levels translator circuit B7. Transistor TP1 is a PFET device with its drain connected to OVDD, its source connected to the output node N1, and its gate connected to the output of levels translating circuit B7. The n-well of transistor TP1 is connected to OVDD.

During operation, when VDD is present, levels translating circuit B7 outputs a GND potential, thereby turning transistor TN1 off and turning on transistor TP1, which propagates OVDD to node N1. In the opposite case, when VDD is not present, levels translating circuit B7 outputs OVDD potential thereby turning off transistor TP1 and turning on TN1, which then propagates GND to node N1.

Figure 3:
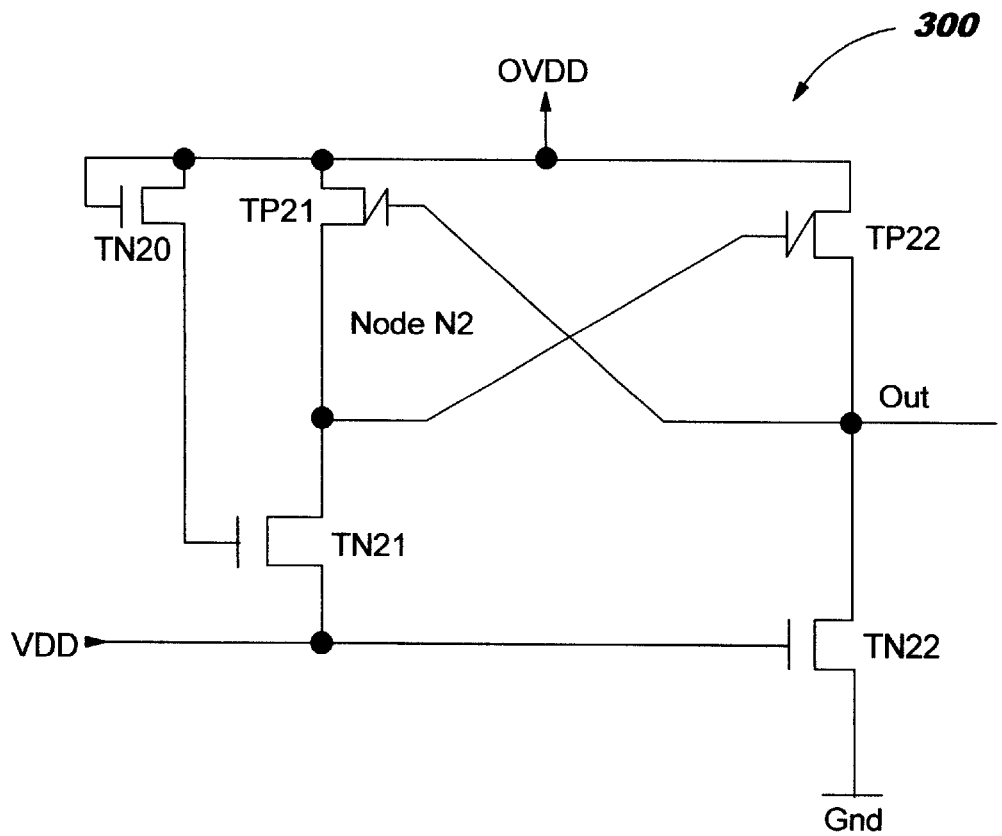
FIG. 3 depicts a schematic diagram of a VDD detection levels translator circuit of the present invention.

An inverting levels translation circuit 300, which is used for detecting the loss of VDD, is illustrated in FIG. 3. This inverting levels translation circuit 300 is represented in FIG. 2 by element B7. Operation of the inverting levels translation circuit 300 is as follows.

Transistor TN20 operates as a diode, resulting in the gate of transistor TN21 being biased to the difference of OVDD-Vt volts (e.g., 3.3 v−0.5 v=2.8 v). Transistor TN20 can be supplemented by adding additional diode connected NFETs in series with it to reduce the gate bias point of transistor TN21. In normal functional mode, where VDD is powered up, the application of VDD to the gate of transistor TN22 causes transistor TN22 to conduct, thereby forcing a logic zero at node Out, which in turn causes transistor TP21 to conduct forcing node N2 to OVDD volts thereby turning off transistor TP22 and transistor TN21.

In the failure mode, defined as a loss of VDD, VDD is essentially connected to ground. Hence, transistor TN22 is inactive, thereby releasing node Out and transistor TN21 is now active and discharges node N2 to ground, which in turn activates transistor TP22, forcing node Out to OVDD and turns off transistor TP21.

It should be noted that other levels translation or detection schemes can be employed to drive the control line of the bias select circuitry.

Still another approach is to connect the output of the levels translator circuit B7 directly to the gate of transistor T11 of the off-chip driver 100 and thereby eliminate the pass gate configuration of FIG. 3. This approach will certainly work logically, but circuit performance may be impacted as the ability of the levels translator circuit B7 to maintain a solid OVDD potential may be comprised during switching activity of the off-chip driver.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor chip, comprising:

a first plurality of circuits connected to a first voltage contact having a first voltage potential, and to a ground contact;

a second plurality of circuits connected to a second voltage contact having a second voltage potential, and to said ground contact;

a detection circuit connected to said first voltage contact, said second voltage contact, and said ground contact, and having an output node;

said detection circuit adapted to operate by detecting the loss of voltage potential at said first voltage contact;

said detection circuit adapted to pull said output node to said second voltage potential when said first voltage potential and said second voltage potential are both present; and said detection circuit adapted to pull said output node to ground potential when said first voltage potential is not present.

2. The semiconductor chip of claim 1, wherein the first and second plurality of circuits are implemented with complementary metal oxide semiconductor (CMOS) transistors.

3. The semiconductor chip of claim 1, wherein the first voltage contact is at a nominal voltage of about 2.5 volts.

4. The semiconductor chip of claim 1, wherein the second voltage contact is at a nominal voltage of about 3.3 volts.

5. The semiconductor chip of claim 2, wherein the detection circuit comprises:
an inverting levels translator circuit; and
a select circuit.

6. The semiconductor chip of claim 5, wherein said select circuit comprises:
a first transistor and a second transistor;
the first transistor is an NFET with its source connected to ground, its drain connected to the output node, and its gate connected to the output of said inverting levels translator circuit; and
the second transistor is a PFET with its drain connected to said second voltage potential, its source connected to the output node, and its gate connected to the output of the inverting levels translator circuit.

7. A semiconductor chip, comprising:
a first plurality of circuits connected to a first voltage contact having a first voltage potential, and to a ground contact, wherein said first plurality of circuits are implemented with complementary metal oxide semiconductor (CMOS) transistors;
a second plurality of circuits connected to a second voltage contact having a second voltage potential, and to said ground contact, wherein said second plurality of circuits are implemented with complementary metal oxide semiconductor (CMOS) transistors;
a detection circuit connected to said first voltage contact, said second voltage contact, and said ground contact, and having an output node;
said detection circuit adapted to operate by detecting the loss of voltage potential at said first voltage contact;
said detection circuit adapted to pull said output node to said second voltage potential when said first voltage potential and said second voltage potential are both present; and
said detection circuit adapted to pull said output node to ground potential when said first voltage potential is not present;
said detection circuit comprising an inverting levels translator circuit and a select circuit, wherein said inverting levels translator circuit further comprises:
first, second and third NFET transistors;
first and second PFET transistors;
said first NFET transistor having its source connected said second voltage potential, its drain connected to the gate of the second NFET transistor, and its gate connected to the second voltage potential;
said second NFET transistor having its source connected to a second node, its drain connected to said first voltage potential, and its gate connected to the drain of said first NFET transistor;
said third NFET transistor having its drain connected to an output node of said inverting levels translator circuit, its source connected to ground potential, and its gate connected to said first voltage potential;
said first PFET transistor having its source connected to said second voltage potential, its drain connected to said second node, and its gate connected to said output node of said inverting levels translator circuit; and
said second PFET transistor having its source connected to said second voltage potential, its drain connected to said output node of said inverting levels translator circuit, and its gate connected to said second node.

8. A semiconductor interface circuit for translating lower voltage logic levels into higher voltage logic levels and vice versa, comprising:
a first voltage contact;
a second voltage contact;
a ground contact;
a detection circuit having an output node, and adapted to force said output node to ground potential, only when a second voltage source is connected to said second voltage contact and no voltage source is connected to said first voltage contact, wherein said detection circuit includes a sensing circuit, and wherein said sensing circuit monitors the voltage levels at the first and second voltage contacts; and
wherein the semiconductor interface circuit is adapted to enter a high impedance state when said output node is pulled to said ground potential at the ground contact.

9. The semiconductor interface circuit of claim 8, wherein said detection circuit further includes a bias circuit.

10. A method of protecting circuitry in a semiconductor chip, comprising:
providing a first plurality of circuits connected to a first voltage contact and a ground potential contact;
providing a second plurality of circuits connected to a second voltage contact and said ground potential contact;
providing a detection and bias circuit connected to said first voltage contact and said second voltage contact, and having an output node, said detection and bias circuit operating by forcing said output node to said ground potential contact only when a second voltage source is connected to said second voltage contact and no voltage source is detected at said first voltage contact; and
connecting at least one of said second plurality of circuits to said output node of said detection and bias circuit.

11. The method of claim 10, further comprising the step of:
adapting at least one of said second plurality of circuits to enter a high impedance state when said output node is pulled to said ground contact.

12. The method of claim 10, further comprising the step of providing an inverting levels translator circuit for monitoring the presence of a first voltage potential at the first voltage contact as part of the detection and bias circuit.

13. A two-supply input/output protection circuit comprising:
a driver input stage having a data input connected to a first levels translation apparatus and an enable input connected to a second levels translation apparatus, wherein each of said first and second levels translation apparatus has an output connected to an output of said input stage;
a detection stage having a pre-drive stage comprising a NAND gate and a NOR gate, said detection stage operationally connected to said output of said input stage;
an output stage operationally connected to an output of the pre-drive stage; and
a loss detection stage having an inverter stage and a voltage bias stage, said inverter stage operationally connected to said driver input stage, and said voltage bias stage operationally connected to said output stage.

14. The protection circuit of claim 13, said voltage bias stage further comprising:
a first transistor, said first transistor being a p-channel field effect transistor (PFET); and
a second transistor, said second transistor being an n-channel field effect transistor (NFET).

15. The protection circuit of claim 14, wherein the first transistor and the second transistor operationally form a select circuit.

16. The protection circuit of claim 13 wherein the voltage bias stage comprises:
   a PFET device with its drain connected to a first voltage potential, its source connected to an output, its gate connected to the output of said inverter stage; and
   an NFET device with its source connected to ground potential, its gate connected to the gate of said PFET device, and its drain connected to said output.

17. The protection circuit of claim 13, wherein the output stage is switchable to a high impedance state.

18. A two-supply input/output protection circuit comprising:
   a driver input stage having a data input connected to a first levels translation apparatus and an enable input connected to a second levels translation apparatus, wherein each of said first and second levels translation apparatus has an output connected to an output of said driver input stage;

a detection stage having a pre-drive stage comprising a NAND gate and a NOR gate, said detection stage operationally connected to said output of said driver input stage;

an output stage operationally connected to an output of the pre-drive stage;

a loss detection stage having an inverter stage and a voltage bias stage, said inverter stage operationally connected to said driver input stage, and said voltage bias stage operationally connected to said output stage; and said inverter stage including an inverting levels translation circuit for monitoring the presence of a first voltage potential and a second voltage potential.

* * * * *